(12) United States Patent
Bydder et al.

(10) Patent No.: US 6,900,631 B2
(45) Date of Patent: May 31, 2005

(54) SYNTHESIZED AVERAGING USING SMASH

(75) Inventors: Mark Bydder, London (GB); David J. Larkman, London (GB); Joseph V. Hajnal, London (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/126,177

(22) Filed: Apr. 19, 2002

(65) Prior Publication Data

US 2003/0025500 A1 Feb. 6, 2003

(30) Foreign Application Priority Data

Apr. 20, 2001 (GB) .............................................. 0109789

(51) Int. Cl.[7] .............................................. G01V 3/00
(52) U.S. Cl. ........................................................ 324/307
(58) Field of Search ................................. 324/307–309, 324/318, 322; 600/410

(56) References Cited

U.S. PATENT DOCUMENTS

| | | | | |
|---|---|---|---|---|
| 4,443,760 A | * | 4/1984 | Edelstein et al. | 324/309 |
| 4,612,504 A | * | 9/1986 | Pelc | 324/309 |
| 4,777,438 A | * | 10/1988 | Holland | 324/309 |
| 4,885,542 A | * | 12/1989 | Yao et al. | 324/313 |
| 5,086,275 A | * | 2/1992 | Roemer | 324/309 |
| 5,109,854 A | * | 5/1992 | Provost | 600/410 |
| 5,179,332 A | * | 1/1993 | Kang | 324/313 |
| 5,910,728 A | * | 6/1999 | Sodickson | 324/309 |
| 6,144,873 A | * | 11/2000 | Madore et al. | 600/410 |
| 6,289,232 B1 | * | 9/2001 | Jakob et al. | 600/410 |
| 6,380,741 B1 | * | 4/2002 | Hajnal et al. | 324/318 |
| 6,396,269 B1 | * | 5/2002 | Hajnal et al. | 324/307 |
| 6,424,152 B1 | * | 7/2002 | Prins et al. | 324/307 |
| 6,518,760 B2 | * | 2/2003 | Fuderer et al. | 324/307 |
| 6,556,009 B2 | * | 4/2003 | Kellman et al. | 324/309 |
| 6,593,741 B2 | * | 7/2003 | Bydder et al. | 324/307 |
| 6,664,787 B2 | * | 12/2003 | Miyoshi et al. | 324/307 |

FOREIGN PATENT DOCUMENTS

| | | |
|---|---|---|
| EP | 1 014 102 | 6/2000 |
| JP | 10-234707 | * 9/1998 |
| WO | WO 98/21600 | 5/1998 |
| WO | WO 99/54746 | 10/1999 |
| WO | WO 00/72034 | 11/2000 |

OTHER PUBLICATIONS

Search Report under Section 17(5) for Application GB 0109789.8 dated Nov. 15, 2001.

M.A. Griswold, P.M. Jakob, R.R. Edelman, D.K. Sodickson, "Alternative EPI Acquisition Strategies Using SMASH"; Proceedings of the Int'l. Society for MR in Med., 6th Scientific Mtg., ISMRM '98, Sydney, Apr. 1998, vol. 1, p. 423.

(Continued)

Primary Examiner—Brij Shrivastav
Assistant Examiner—Dixomara Vargas
(74) Attorney, Agent, or Firm—Thomas M. Lundin

(57) ABSTRACT

In apparatus for magnetic resonance imaging equipped for parallel imaging, in the sense that an array of receive coils can be used to regenerate data at phase-encode gradients interposed between those at which measurements were taken, the full set of data is collected, which is then split into two sets with a greater separation of phase-encode gradients (FIGS. 13 and 14). These sets are then each regenerated (FIGS. 15 and 16), enabling spurious data to be excised from the original data set by comparison of the two representations.

7 Claims, 3 Drawing Sheets

OTHER PUBLICATIONS

S. Kuhara, Y. Kassai, Y. Ishihara, M. Yui, Y. Hamamura, H. Sugimoto "A Novel EPI Reconstruction Technique Using Multiple RF Coil Sensitivity Maps", Proc. of Int'l. Society for MR in Med, Eighth Scientific Mtg., Denver, CO., Apr. 2000, vol. 1, p. 154.

Mark Bydder, et al.; "Motion artefact reduction using SMASH", Proc. of Int'l, Soc. Mag Res. in Med. 9th Scientific Mtg., Apr. 2001, vol. 1. p. 734.

M. Bydder, et al., "Detection and Elimination of Motion Artifacts by Regeneration of k–Space"; Mag. Res. in Medicine, vol. 47, pp. 677–686 (2002).

Bruno Madore and R. Mark Henkelman, "A new way of averaging with applications to MRI"; Medical Physics, vol. 23, No. 1, 1996, pp. 109–113.

* cited by examiner

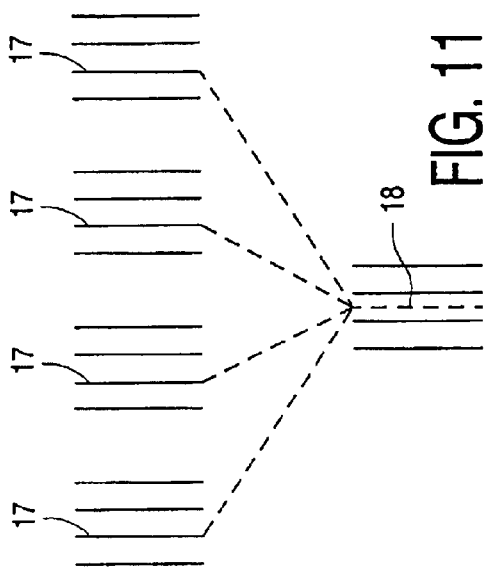
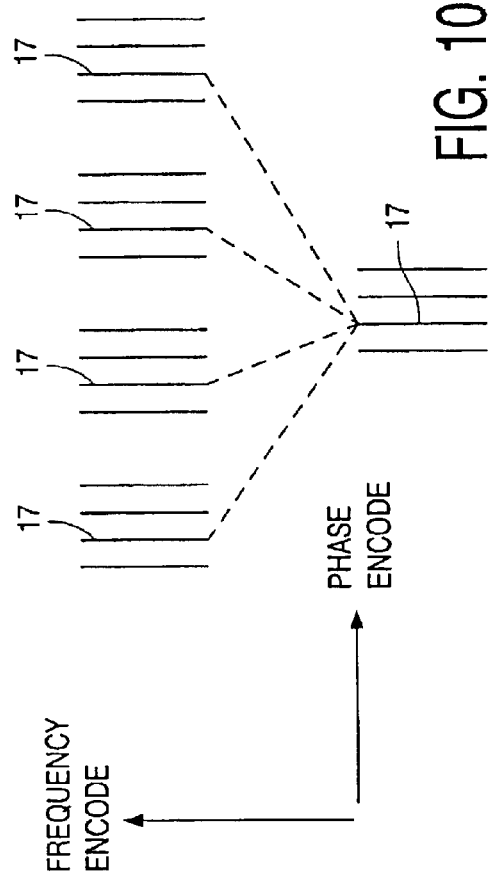
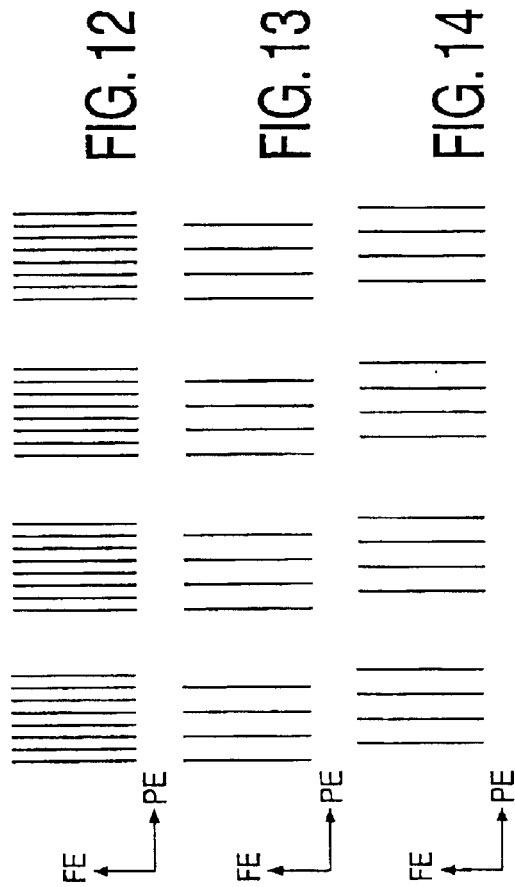

SYNTHESIZED AVERAGING USING SMASH

BACKGROUND

This invention relates to magnetic resonance (MR) imaging.

A prior art magnetic resonance imaging apparatus is shown in FIG. 1. A patient 1 (shown in section) is slid axially into the bore 2 of a superconducting magnet 3, and the main magnetic field is set up along the axis of the bore, termed by convention the Z-direction. Magnetic field gradients are set up, for example, in the Z-direction, to confine the excitation of magnetic resonant (MR) active nuclei (typically hydrogen protons in water and fat tissue) to a particular slice in the Z-direction e.g. that illustrated in FIG. 1 and, in the horizontal X and the vertical Y-directions as seen in FIG. 1, to encode the resonant MR nuclei in the plane of the slice. An r.f. transmit coil (not shown) applies an excitation pulse to excite the protons to resonance, and an r.f. receive coil array consisting of a pair of coils 4, 5 picks up relaxation signals emitted by the disturbed protons.

To encode/decode received signals in the Y-direction, the signals are detected in the presence of a magnetic field gradient, termed a frequency encode or read-out (R.O.) gradient, to enable different positions of relaxing nuclei to correspond to different precession frequencies of those nuclei about the direction of the main magnetic field due to the influence of the gradient. The data is digitised, and so for each r.f. excitation pulse, a series of digital data points are collected, and these are mapped into a spatial frequency domain known as k-space (FIG. 2). Each r.f. pulse permits at least one column of digital data points to be collected.

To encode/decode the received signals in the X-direction, after each r.f. pulse has been transmitted and before data is collected with the read-out gradient applied, a magnetic field gradient in the X-direction is turned on and off. This is done for a series of magnitudes of magnetic field gradients in the X-direction, one r.f. pulse typically corresponding to a different magnitude of gradient in the X-direction. The series of measurements enable spatial frequencies to be built up in the X-direction.

On the k-space matrix shown in FIG. 2, the columns of data points correspond to data collected at different magnitudes of phase-encode (P.E.) gradients.

The field of view imaged by the magnetic resonance imaging apparatus depends on the spacing of the data points in the phase-encode and read-out directions, and the resolution of the image depends on how far the points extend in each direction i.e. how large the maximum phase-encode gradient is, and on the magnitude of the read-out gradient combined with the duration of data collection.

Conventionally, the data collected by the r.f. receive coil arrangement and depicted in FIG. 2 is subject to a two dimensional fast Fourier Transform in a Fourier Transform processor (not shown) to produce a pixelated spatial image.

A slice image is shown in FIG. 3. For the purposes of explanation, the symbol of a circle 1a, has been illustrated in both the patient 1 shown in FIG. 1 and the image shown in FIG. 3. FIG. 3 implies that the spacing of data points in the phase-encode gradient direction is sufficient to image the whole of the circle shown in FIG. 1.

Between each r.f pulse, there is a certain minimum pulse repetition time, and the collection of data implied by FIGS. 2 and 3 may therefore take an undesirably long time.

One technique used to reduce the data collection time is to cut out, say, half the phase-encode steps e.g. by keeping the same maximum phase-encode gradient but omitting every other column of data. This would then halve the data collection time.

The spacing of the data points in the phase-encode direction would now have doubled, so that the field of view in the corresponding image domain would have halved. (The field of view in the read-out direction would remain the same because the number of data points collected during read-out would remain the same.) The imaged area would now cover little more than half the width of the circle illustrated in FIG. 1. This is shown by the area 1b in FIG. 5. Unfortunately, aliasing causes the regions at the side of the circle to be folded back into the half-width area, the left hand region in FIG. 5 corresponding to the right hand region of the image, and vice versa.

To enable the data to be unfolded, the data is acquired using parallel imaging.

Parallel imaging makes use of spatial sensitivity differences between individual coils in an array to reduce the gradient encoding required during image acquisition. This reduces acquisition times by decreasing the number of phase-encoded lines of k-space that must be acquired. There are three distinct classes of practical implementation of parallel imaging, which are known as SENSE (Magnetic Resonance in Medicine 42: 952–962 (1999)—SENSE: Sensitivity Encoding for Fast MRI by Klaas P Pruessmann, Markus Weiger, Markus B Scheidegger and Peter Boesiger), SMASH (WO-A-98/21600 and Magnetic Resonance in Medicine 38: 591–603 (1997)—Simultaneous Acquisition of Spatial Harmonics (SMASH): Fast Imaging with Radiofrequency Coil Arrays by Daniel K Sodickson and Warren J Manning) and SPACE-RIP (WO-A-00/72050 and Magnetic Resonance in Medicine 44:301–308 (2000)—Sensitivity Profiles from an Array of Coils for Encoding and Reconstruction in Parallel (SPACE RIP) by Walid E Kyriakos, Laurence P Panyah, Daniel F Kaches, Carl-Frederick Westin, Sumi M Bao, Robert V Mulkern and Ferenc A Jolesz). All of these methods require information about the coil sensitivity profiles (reference data), which is used to regenerate a full image data set from the sub-sampled k-space acquisition (target data).

SENSE operates in the image domain for both the target image data and the coil reference data. The method can be used with a wide range of coil geometries. A typical receive coil arrangement comprises coils 4 and 5 placed on opposite sides of the patient arranged in FIG. 1, in order that they have different fields of view. The target data is acquired for each receive coil with a reduced field of view, which results in aliasing, so that each coil produces a k-space representation as shown in FIG. 4, which can be Fourier Transformed into an aliased image as shown in FIG. 5. The two aliased images of FIG. 5 are then unfolded to the full field of view on a pixel by pixel basis using reference data, which records the relative responses of the receive coils 4 and 5. Reduced field of view imaging imposes a requirement of uniformly spaced samples in the phase-encode direction in k-space. Since processing concerned with unfolding is done in the image domain, individual pixels in the reduced field of view data get unfolded by integer numbers of final pixels (i.e. $1 \rightarrow 1$, $1 \rightarrow 2$, $1 \rightarrow 3$ etc). This requires solution of a set of linear simultaneous equations in which pixel intensities are weighted by the coil sensitivity at the final pixel locations. The numerical condition of these equations determines the local noise properties of the unfolded image, so that the signal-to-noise ratio (SNR) varies from pixel to pixel. The signal-to-noise ratio is better in the regions (e.g. in FIG. 5) where no aliasing occurs than where it does occur. The resulting patterns of noise variation generally reflect the coil geometry and can have a strong perceptual effect.

SPACE RIP uses k-space target data as input in conjunction with a real space representation of the coil sensitivities to directly compute a final image domain output, that is, the Fourier transform is embedded into the matrix involved. An unfolded image is directly produced from the reduced phase-encode gradient encoded collected data for the coils of the array (FIG. 4). Thus, it is a hybrid k-space/real space method and has a higher computational burden than either SENSE or SMASH, but does not require uniform sampling of k-space.

SMASH operates in k-space for the target image data but uses a real space representation of the coil sensitivity profiles. SMASH employs linear combinations of the coil reference data to explicitly construct spatial harmonics that are required to synthesis missing k-space lines. It does not suffer from spatially varying signal-to-noise ratio in the final images, since each point in k-space contributes to the whole image in the image domain.

A typical coil arrangement for SMASH is shown in FIG. 6. An array of coils 6 to 13 is arranged beneath the spine 14 of a patient 7 (shown schematically). Such a coil arrangement can be used to produce a saggital (vertical longitudinal) section through the spine (plane 15). The response patterns of the individual coils is shown in FIG. 7. If the outputs of the individual coils is suitably weighted and summed, it can be seen that, for example, the response of FIG. 8, and its simplified form of FIG. 9, can be produced. Such a weighted and summed signal modulates received r.f. signals along the length of the array in the same way as a phase-encoding gradient in the Z-direction modulates r.f. signals received by an equivalent received coil 16 (shown dotted). Accordingly, SMASH uses weighted combinations of the outputs of the individual coils of the array to simulate the effect of phase-encode gradients on the received r.f signals. The fundamental is shown in FIGS. 8 and 9, but different weightings can be used to produce higher harmonics. Thus, signals representing several phase-encode gradient lines can be produced for the application of one phase-encode gradient.

However, SMASH is somewhat restrictive in the coil geometries it can accommodate. In particular, it is not well suited to use with very few coils and the requirement to generate specific spatial harmonics necessitates a given relationship between the imaging field of view and the coil structure.

A simplified example of the SMASH process will be described with reference to FIGS. 10 and 11. The vertical lines represent columns of points in k-space in the frequency encode direction.

It is assumed that the spine array of FIG. 6 is used, but that there are four coils. It is assumed that there are only four phase-encoding gradient steps. Thus, each coil collects signal at each phase-encode gradient so that 16 signals are collected. The outputs of each coil for each phase-encode gradient are combined to produce a resultant signal for that phase-encode gradient. For example, in FIG. 10, line 17 represents the output of each coil at the second phase-encode gradient, and these signals are used to produce a resultant signal at that phase-encode gradient. The interpolated signals corresponding to notional phase-encode gradients are produced from these resultant signals together with a phase rotation reflecting the different modulation between the phase-encode gradient of the resultant and of the interpolated phase-encode line. The resultant and the interpolated lines in FIGS. 10 and 11 are produced on a point by point basis from the resultants of the corresponding points on the lines 17.

Clearly there will usually be considerably more than four phase-encode gradients, and more coils than four may be used. Nevertheless, it will be seen that in the SMASH method, measurements may be made as a reduced number of phase-encode gradients, and data corresponding to the omitted ones may be generated using the SMASH method.

SUMMARY

The invention provides apparatus for magnetic resonance imaging, comprising means for exciting magnetic resonant (MR) active nuclei in a region of interest, an array of at least two r.f receive coils for receiving data from the region of interest, means for creating a set of magnetic field gradients in a phase-encode direction for spatially encoding the excited MR active nuclei, and means for processing the received signals by dividing them into at least two sets so that each set has more widely spaced phase-encode gradients and by using the plurality of signals from the coils to regenerate a complete representation of the image region from each set.

The use of the array coils to generate at least two complete representations enables fluctuations due to extraneous processes e.g. motion of a patient during collection of one particular phase-encode gradient, to be identified.

Once such a spurious result has been identified, there are various ways of dealing with it. For example, the full representations could simply be averaged, or they could be compared in some way, for example, subtracted, in order to highlight spurious data. Thus, if it turns out that one particular line is spurious because for example the patient moved when data was being collected at that particular phase-encode gradient, then the original data set could be reprocessed with the omission of the data collected at that single phase-encode gradient, in order to obtain an improved result.

The representation of the image region from each set could be in the image domain, as in the SENSE process, but preferably it is in the spatial frequency i.e. k-space domain, so that a Fourier Transform is necessary to produce a real image. The latter method implies the use of the generation of notional interpolated phase-encode gradients from a knowledge of coil geometry, such as in the known SMASH method. However, the regeneration may also be performed by a generalised method for the construction of interpolated phase-encode lines as described in our co-pending patent application reference P/63247.

DRAWINGS

Magnetic resonance imaging apparatus and a method of magnetic resonance imaging will now be described in detail, by way of example, with reference to the accompanying drawings, in which:

FIG. 10 is a representation of the generation of k-space lines according to the SMASH method to produce resultant lines at the phase-encode gradients at which signals are collected;

FIG. 11 is a representation of the generation of k-space lines according to the SMASH method to generate phase-encode lines interpolated between the gradients at which measurements were made;

FIG. 12 is a representation of k-space lines collected in accordance with the invention;

FIG. 13 is a representation of the division of those lines to produce a first set with more widely spaced phase-encode gradients;

FIG. 14 is a representation of the division of the k-space lines of FIG. 12 into a second set with more widely spaced phase-encode gradients;

FIG. 15 is a representation of a regenerated set of k-space lines derived from those of FIG. 13; and FIG. 16 is a representation of a regenerated set of k-space lines produced from the k-space lines of FIG. 14.

DESCRIPTION

Figure 1:
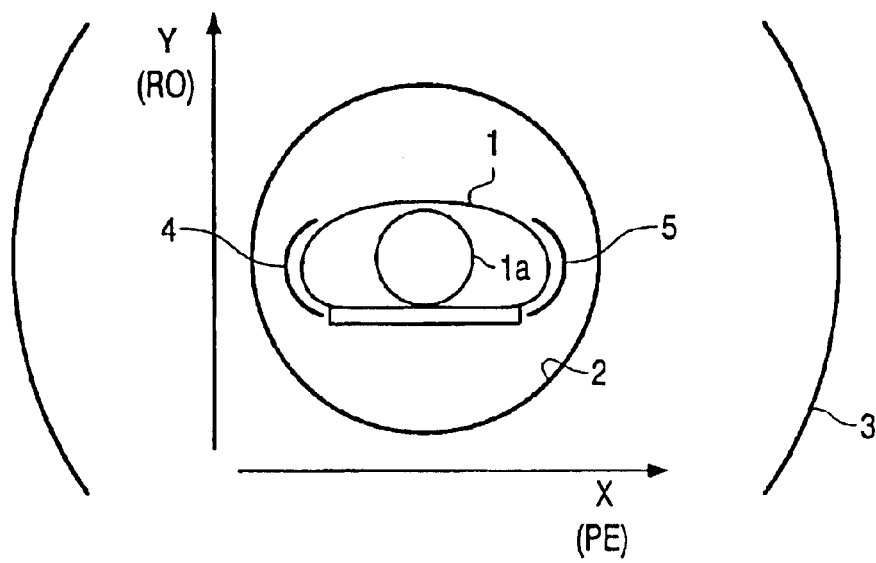
FIG. 1 is a schematic axial sectional view of known magnetic resonance imaging apparatus.
Figure 2:
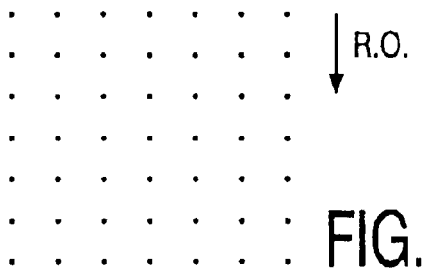
FIG. 2 is a representation of data in k-space resulting from the signal picked up by a receive coil of the apparatus.
Figure 3:
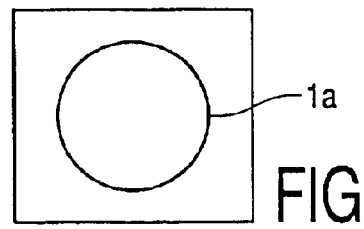
FIG. 3 is a representation of the shape in the image domain represented by the data in k-space.
Figure 4:
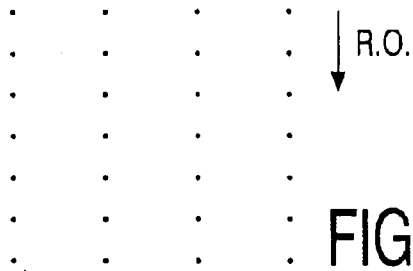
FIG. 4 is a representation of data in k-space with a reduced number of phase-encode gradients, picked up by a receive coil of the apparatus.
Figure 5:
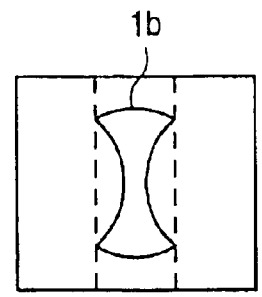
FIG. 5 is a representation of the aliased shape in the image domain represented by the data of FIG. 4.
Figure 6:
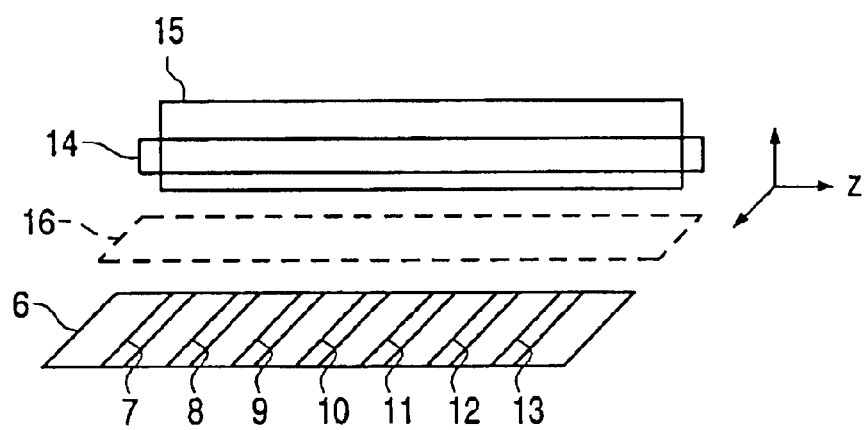
FIG. 6 is a perspective schematic view of an array of coils for use in SMASH type imaging.
Figure 7:
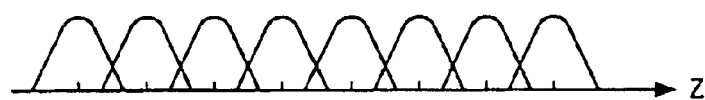
FIG. 7 is a graph showing the spatial sensitivity profiles of the coils of the array in FIG. 6.
Figure 8:
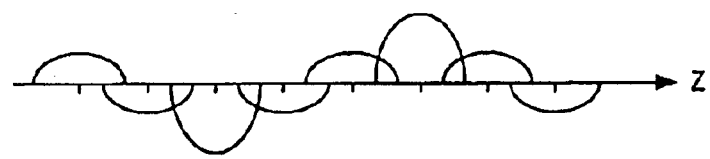
FIG. 8 is a graph showing the profiles of FIG. 7 weighted to produce a sine wave modulation.
Figure 9:
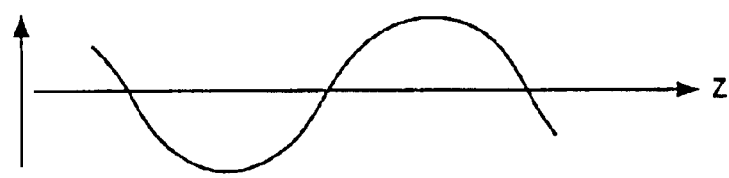
FIG. 9 is a graph showing the simplified sine wave produced by the weighting of FIG. 8.

The magnetic resonance imaging apparatus of the invention comprises a known spine coil as shown in FIG. 6, arranged with its axis extending along the bore of an electromagnet of the kind shown in FIG. 1. The patient is slid into the bore 2 of the electromagnet in the manner shown in FIG. 1, but the spine coil array 6–13 is arranged beneath him extending along the axis of the bore.

To continue with the example mentioned before with reference to FIGS. 10 and 11, in the SMASH method, assuming there were only four coils in the array and only four phase-encode gradients where applied, sixteen signals would be collected from the coils of the array at each phase-encode gradient for each coil. From this, resultant lines at those phase-encode gradients would be produced (FIG. 10) together with interpolated lines between those resultant lines (FIG. 11).

The object of this would be to save on data collection time, since an image corresponding to the closer spaced lines with interpolated lines present would be produced at the expense of half that number of phase-encode gradients.

According to the invention, a full set of data is collected at each of the measured phase-encode gradients of the SMASH method and also at those phase-encode gradients which were previously computed in the manner shown in FIG. 11.

The signals collected from the individual coils (twice as many phase-encode gradients as in the SMASH method) is now divided into two subsets as shown schematically in FIGS. 13 and 14, the data collected at alternate phase-encode gradients being grouped together. The SMASH method is then used to regenerate a full set of data from each of the two subsets, so that two complete sets of k-space lines are produced (FIGS. 15 and 16).

These two representations of the region to be imaged may now be dealt with in various ways. First, the k-space matrices may be simply averaged. Then, the effect of spurious data such as if the patient moved while data from one phase-encode gradient was being collected, would be reduced.

However, the two representations of data in k-space are subtracted one from the other. The result of this will be general noise, unless spurious data is present, in which case this will show up clearly. In this case, the originally received data may be reprocessed omitting the spurious data.

For example, imagine that the patient moved when the first phase-encode gradient was applied. This would mean that the first line of k-space in FIG. 13 would be impaired, whereas that in FIG. 14 would not be. The regenerated data in FIG. 16 would not be subject to the defect, whereas that represented by FIG. 15 would be. Subtraction of one from the other would show lines 1 and 2 of FIG. 15 were spurious (since lines 1 and 2 are generated by line 1 of the coil outputs of FIG. 13). The data received and represented in FIG. 12 could then be reprocessed using the SMASH or some other method, omitting the data collected at the first phase-encode gradient and regenerating just this line of data from the others and the multiple coils, with the result of a considerable improvement in image quality.

If, on the other hand, no artefacts are present, data can be reconstructed for optimal signal-to-noise ratio.

The processing to produce the regenerated images has been described as taking place using the SMASH method. However, the generalised method for the reconstruction of spatial harmonics described in our co-pending patent application reference P/63247 could equally well be used.

Also, the regeneration could be carried out in the image domain as in the SENSE method, and the reconstructed images compared.

While reference has been made to four phase-encode gradients, typically a much larger number will be employed, for example, 256, in which case 256 data points would also be collected in the phase-encode direction.

Any number of coils may be used for the array coils, and more than two sets of data may be collected if desired. If the SENSE method is used, a pair of receive coils as shown in FIG. 1 may be used, and if the apparatus described in our co-pending patent application P/63247 is used, a single pair of planar anterior and posterior coils may be used.

It goes without saying that the invention is applicable to all types of electromagnets i.e. resistive or superconducting, and also to all types of magnet configurations i.e. solenoidal or open.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. Apparatus for magnetic resonance imaging, comprising means for exciting magnetic resonant (MR) active nuclei in a region of interest, an array of at least two r.f. receive coils for receiving a first set of received signals from the region of interest, means for creating a set of magnetic field gradients in a phase-encode direction for spatially encoding the excited MR active nuclei, and means for processing the first set of received signals by dividing them into at least two sets so that each set includes signals corresponding to more widely spaced k-space lines than the k-space lines of the first set of received signals and by using the plurality of signals from the coils to regenerate a complete representation of the image region from each set.

2. Apparatus for magnetic resonance imaging as claimed in claim 1, in which the processing means is arranged to compare the regenerated complete representations of the imaged region.

3. Apparatus as claimed in claim 2, in which the processing means is arranged to subtract one representation from the other.

4. Apparatus as claimed in claim 2, in which the processing means is arranged to reprocess the received signals after the omission of any spurious data in order to restore the signals at the phase-encode gradient at which the spurious signals were collected.

5. Apparatus as claimed in claim 1, in which the processing means is arranged to regenerate the complete representation in image space.

6. Apparatus as claimed in claim 1, in which the processing means is arranged to regenerate the complete representation in the spatial frequency domain.

7. A method of magnetic resonance imaging comprising exciting magnetic resonant (MR) active nuclei in a region of interest, using an array of at least two r.f. receive coils for receiving a first set of received signals from the region of interest, creating a set of magnetic field gradients in a phase-encode direction for spatially encoding the excited MR active nuclei, and processing the first set of received signals by dividing them into at least two sets so that each set includes signals corresponding to increased k-space line spacing with respect to the k-space line spacing of the first set of received signals and by using the plurality of signals from the coils to regenerate a complete representation of the image signal from each set.

* * * * *